United States Patent
Huang (10) Patent No.: US 7,905,712 B2
(45) Date of Patent: Mar. 15, 2011

(54) CENTRIFUGAL PUMP DEVICE FOR A HEAT-DISSIPATING SYSTEM

(75) Inventor: Kau-Chung Huang, Taipei (TW)

(73) Assignee: Prolynn Technology Inc., Taipei-Hsien (TW)

( * ) Notice: Subject to any disclaimer, the term of this patent is extended or adjusted under 35 U.S.C. 154(b) by 851 days.

(21) Appl. No.: 11/898,680

(22) Filed: Sep. 14, 2007

(65) Prior Publication Data

US 2008/0069706 A1 Mar. 20, 2008

(30) Foreign Application Priority Data

Sep. 18, 2006 (TW) .............................. 95134453 A (51) Int. Cl.
*F04B 35/04* (2006.01)

(52) U.S. Cl. ......... 417/423.7; 417/423.14; 310/40 MM; 310/216.023

(58) Field of Classification Search .................. 417/351, 417/366, 410.1, 420, 423.1, 423.7, 423.14; 361/699; 310/216.023, 216.025, 216.031, 310/216.033, 216.034, 216.035, 49.22–49.31, 310/40 MM See application file for complete search history.

(56) References Cited

U.S. PATENT DOCUMENTS

| | | | | |
|---|---|---|---|---|
| 4,371,821 A | * | 2/1983 | Laesser et al. | 310/49.25 |
| 4,503,346 A | * | 3/1985 | Bertram et al. | 310/49.23 |
| 5,545,017 A | * | 8/1996 | Strohl et al. | 417/423.7 |
| 5,616,974 A | * | 4/1997 | Yamada | 310/68 B |
| 6,171,078 B1 | * | 1/2001 | Schob | 417/423.1 |
| 6,313,554 B1 | * | 11/2001 | Masuzawa et al. | 310/67 R |
| 6,525,938 B1 | * | 2/2003 | Chen | 361/695 |
| 6,599,104 B2 | * | 7/2003 | Saito et al. | 417/366 |
| 6,903,469 B2 | * | 6/2005 | Ng et al. | 310/40 MM |
| 7,312,986 B2 | * | 12/2007 | Tomioka et al. | 417/423.1 |

* cited by examiner

*Primary Examiner* — Devon C Kramer
*Assistant Examiner* — Peter J Bertheaud
(74) *Attorney, Agent, or Firm* — Finnegan, Henderson, Farabow, Garrett & Dunner, L.L.P.

(57) ABSTRACT

A centrifugal pump device includes a motor unit and a pump unit. The motor unit includes two elongated stator units, and a rotor disposed rotatably on a motor housing unit between the stator units. Each of the stator units extends in a direction perpendicular to and spaced apart from a rotating axis of the rotor. The pump unit includes a pump chamber, a plurality of impeller blades disposed in the pump chamber and anchored to the rotor, a pump housing unit attached fixedly and sealingly to the motor housing unit, a liquid passage in fluid communication with the pump chamber, an inlet passage in fluid communication with the liquid passage, and an outlet passage in fluid communication with the pump chamber and extending at least partially into a between-stator region.

10 Claims, 7 Drawing Sheets

| PUMP TYPE | A | | B | | C | |
|---|---|---|---|---|---|---|
| MOTOR POLES | 4-POLE | 8-POLE | 4-POLE | 8-POLE | 4-POLE | 8-POLE |
| WIRING SPACE | ▫▫ ▫ | ▫▫ ▫ | ▯▯ ▫ | ▯▯ ▫ | ▯▯ ▫ | ▯▯ ▫ |

CENTRIFUGAL PUMP DEVICE FOR A HEAT-DISSIPATING SYSTEM

CROSS-REFERENCE TO RELATED APPLICATION

This application claims priority of Taiwanese Application No. 095134453, filed on Sep. 18, 2006.

BACKGROUND OF THE INVENTION

1. Field of the Invention

This invention relates to a centrifugal pump device, and more particularly to a centrifugal pump device for a heat-dissipating system.

2. Description of the Related Art

Figure 1A:
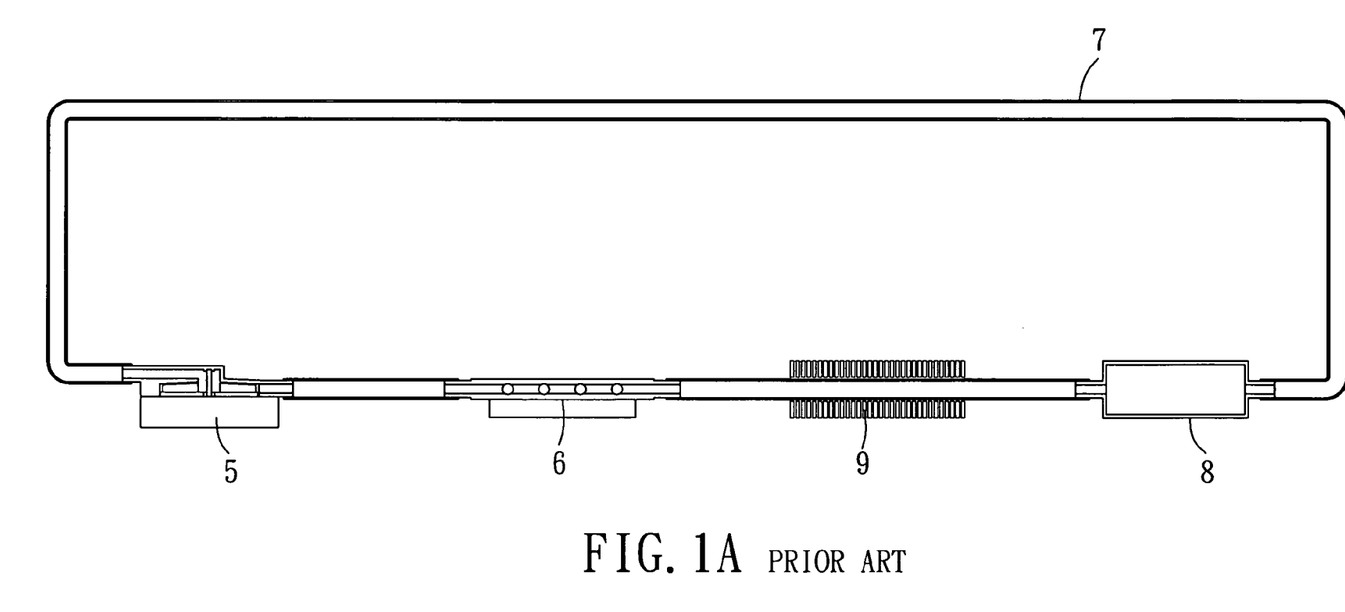
FIG. 1A is a schematic view of a conventional system for dissipating heat from a central processing unit of a computer.

Referring to FIG. 1A, a heat-dissipating system includes a centrifugal pump unit 5, and is used for dissipating heat from a central processing unit (CPU) of a computer (not shown) via a CPU water jacket 6. The pump unit 5 forces a liquid, such as water, to circulate along a conduit unit 7 in the heat-dissipating system. The liquid flows through the water jacket 6, the pump unit 5, a tank 8, and a heat-dissipating unit 9 including a plurality of fins. Further referring to FIGS. 1B and 1C, the pump unit 5 may be a first conventional pump device (A) mounted with an internal stator motor 51 or a second conventional pump device (B) mounted with an external stator motor 52. The external stator motor 52 includes an output shaft 53, a rotor 54 connected fixedly to the output shaft 53, a plurality of radially extending stator cores 55 arranged around the rotor 54, and a plurality of stator windings 56 wound respectively on the stator cores 55.

The aforesaid conventional centrifugal pump device including the external stator motor 52 suffers from many disadvantages. For example, to provide a sufficient power output from the external stator motor 52, the total length of the windings 56 must be greater than a threshold value. Thus, the axial length of the stator cores 55 is increased. As a result, the total axial length of the centrifugal pump device is large and therefore goes against the current trend toward miniaturization in notebook computer design.

Figure 1B:
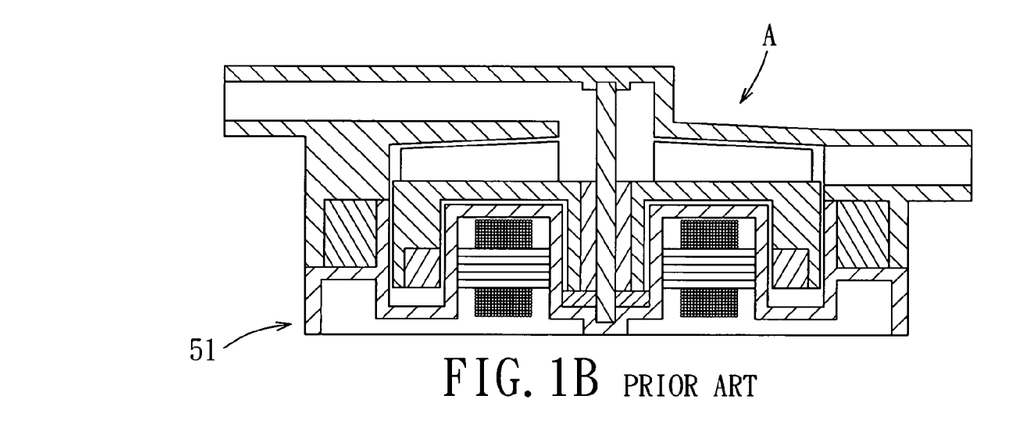
FIG. 1B is a schematic view of a first conventional pump device mounted with an internal stator motor.
Figure 1C:
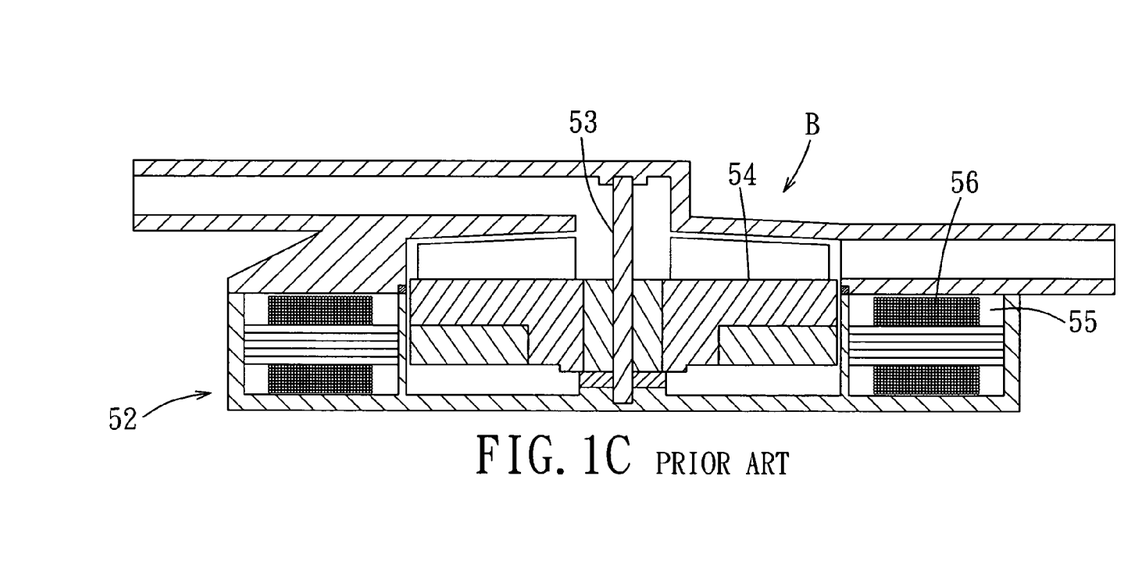
FIG. 1C is a schematic view of a second conventional pump device mounted with an external stator motor.
Figure 1D:
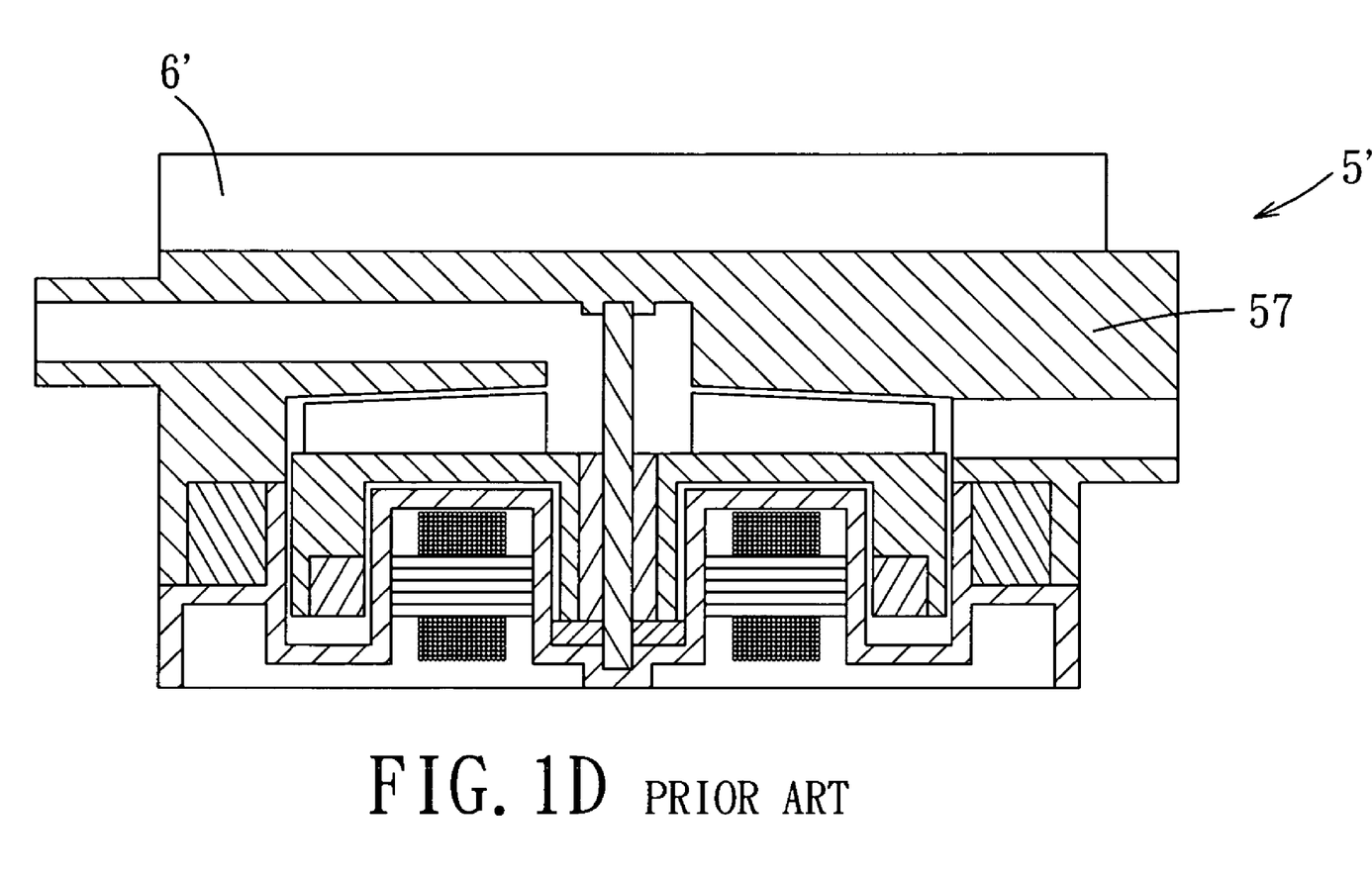
FIG. 1D is a schematic view of a third conventional pump device.
Figure 2:
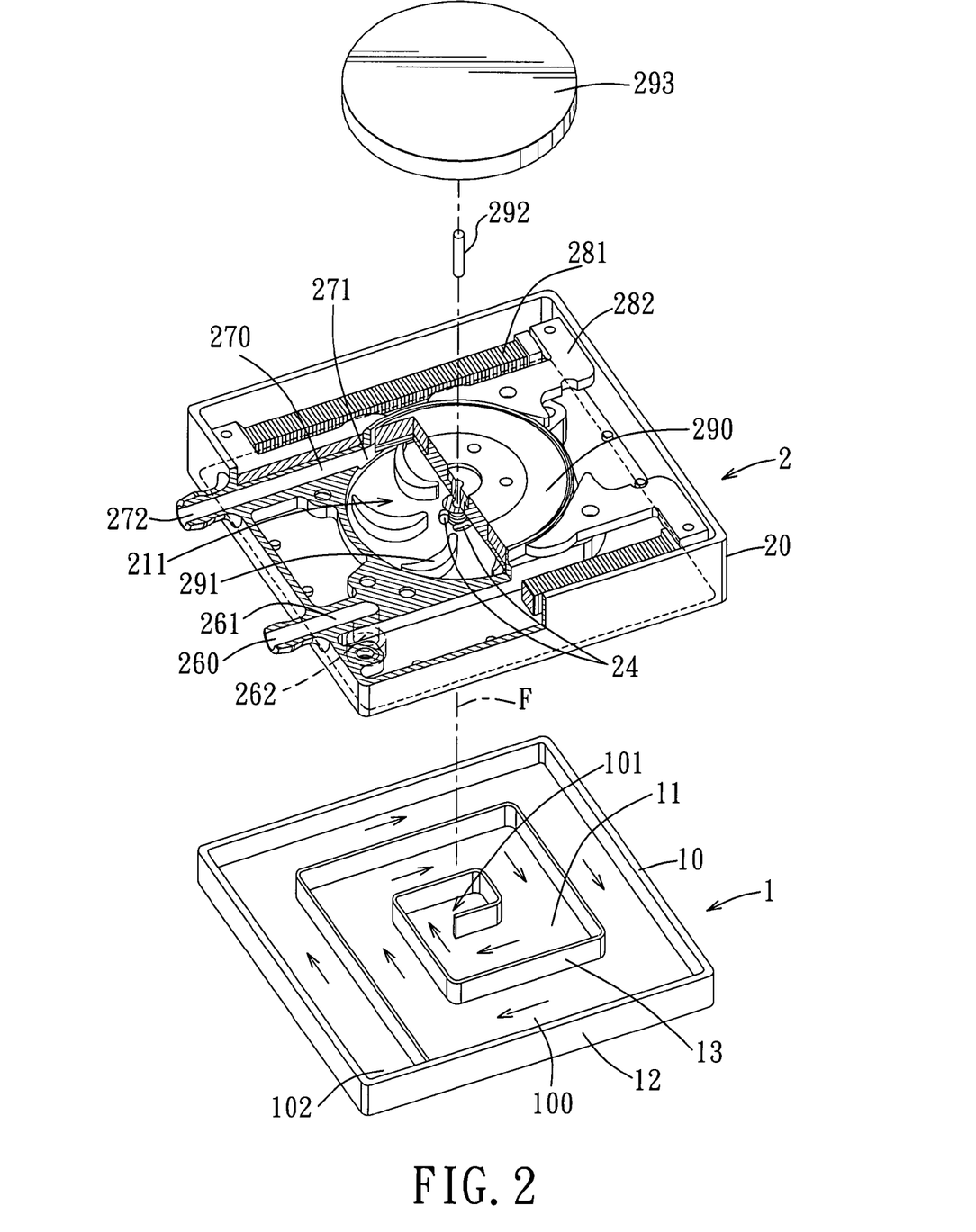
FIG. 2 is a partly exploded perspective cutaway view of the preferred embodiment of a centrifugal pump device according to this invention.
Figure 3:
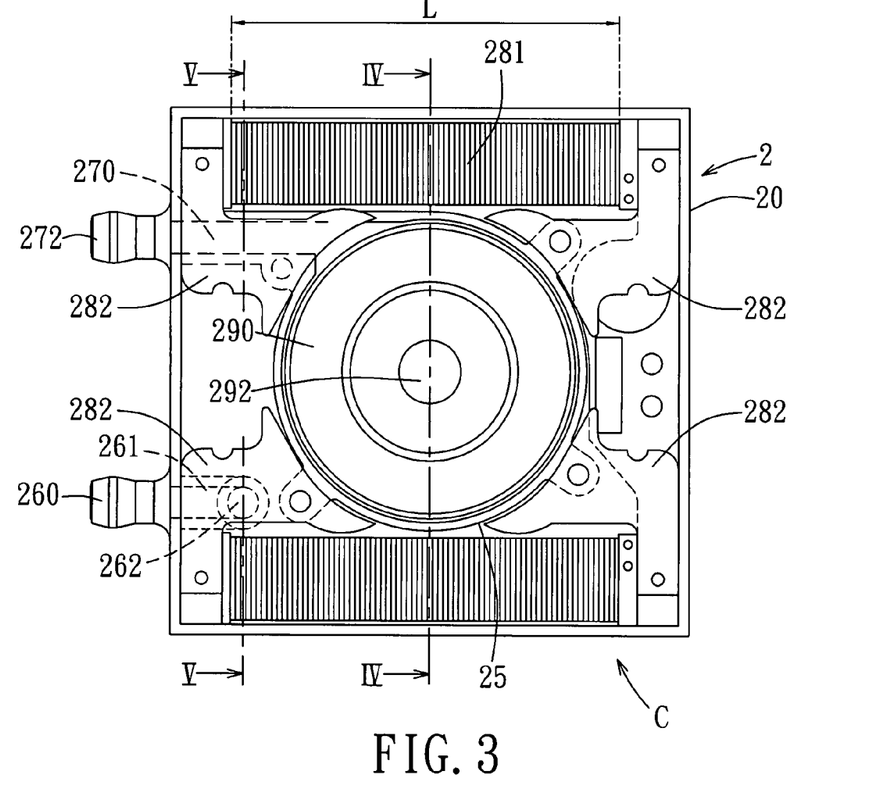
FIG. 3 is a schematic top view of the preferred embodiment.
Figure 4:
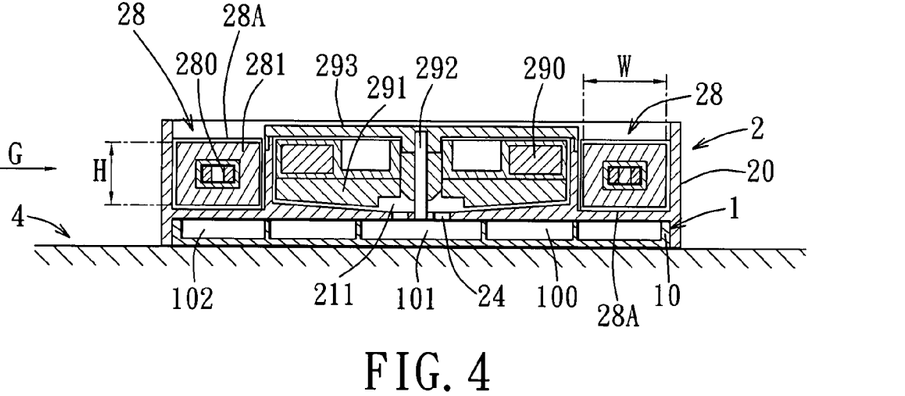
FIG. 4 is a sectional view taken along Line IV-IV in FIG. 3.

Referring to FIG. 1D, in another heat-dissipating system, a third conventional centrifugal pump device 5' includes a housing 57 in thermal contact with a CPU 6'. The third conventional centrifugal pump device 5', however, also has a long axial length.

SUMMARY OF THE INVENTION

The object of this invention is to provide a centrifugal pump device that has a flattened motor unit, thereby resulting in a reduction in the axial length of the centrifugal pump device.

According to this invention, a centrifugal pump device includes a motor unit and a pump unit. The motor unit includes two elongated stator units, and a rotor disposed rotatably on a motor housing unit between the stator units. Each of the stator units extends in a direction perpendicular to and spaced apart from a rotating axis of the rotor. The pump unit includes a pump chamber, a plurality of impeller blades disposed in the pump chamber and anchored to the rotor, a pump housing unit attached fixedly and sealingly to the motor housing unit, a liquid passage in fluid communication with the pump chamber, an inlet passage in fluid communication with the liquid passage, and an outlet passage in fluid communication with the pump chamber and extending at least partially into a between-stator region.

Since each of the stator units extends in a direction perpendicular to and spaced apart from the rotating axis of the rotor, the axial length of the motor unit is reduced.

BRIEF DESCRIPTION OF THE DRAWINGS

These and other features and advantages of this invention will become apparent in the following detailed description of a preferred embodiment of this invention, with reference to the accompanying drawings, in which.

DETAILED DESCRIPTION OF THE PREFERRED EMBODIMENT

Referring to FIGS. 2, 3, 4, and 5, the preferred embodiment of a centrifugal pump device (C) according to this invention is suitable for a heat-dissipating system (not shown) of a notebook computer, and includes a pump unit 1 and a motor unit 2.

The motor unit 2 is a 4-pole motor, and includes a motor housing unit 20, two elongated flat stator cores 280, two stator windings 281, four stator poles 282, a rotor 290, an output shaft 292, and a cover 293. Each of the stator cores 280 cooperates with the corresponding stator winding 281 to constitute a stator unit 28. The rotor 290 is disposed rotatably in the motor housing unit 20 between the stator cores 280, is sleeved fixedly on the output shaft 292, and is rotatable about a rotating axis (F). The stator cores 280 are disposed in the motor housing unit 20, and are parallel to and spaced apart from each other. Each of the stator cores 280 extends in a direction perpendicular to and spaced apart from the rotating axis (F). The stator windings 281 are wound respectively on the stator cores 280. Each of the stator windings 281 is disposed within an annular wiring space (28A) (see FIG. 4) in the motor housing unit 20. Each of the wiring space (28A) has a width (W), a length (L), and a height (H).

Alternatively, the motor unit 2 may be an 8-pole motor.

The pump unit 1 includes a pump chamber 211, a plurality of impeller blades 291, a thermally conducting pump housing unit 10, a rib unit 13, an inlet passage 260, and an outlet passage 270.

The pump chamber 211 is formed in the motor housing unit 20 of the motor unit 2. The impeller blades 291 are disposed in the pump chamber 211, and are anchored to the rotor 290.

The pump housing unit 10 includes a bottom wall 11 disposed under the motor housing unit 20 of the motor unit 2 and disposed above and in thermal contact with a heat source 4, and a surrounding wall 12 extending upwardly from a periphery of the bottom wall 11 and attached fixedly and sealingly to the motor housing unit 20.

The rib unit 13 is disposed between and attached sealingly to the bottom wall 11 of the pump housing unit 10 and the motor housing unit 20 so as to define a spiral liquid passage 100 therebetween. The spiral liquid passage 100 has an inner end 101 disposed in proximity to a central portion of the pump housing unit 10 and in fluid communication with the pump chamber 211 via a plurality of orifices 24, and an outer end 102 disposed in proximity to a peripheral portion of the pump housing unit 10.

The inlet passage 260 is formed in the motor housing unit 20, and has a long horizontal passage portion 261 extending along a direction parallel to the stator cores 280 for permitting liquid to flow into the motor housing unit 20 therethrough, and a short vertical passage portion 262 in fluid communication with the outer end 102 of the spiral liquid passage 100. As such, the liquid can flow into the spiral liquid passage 100 through the inlet passage 260 to absorb heat. The rotor 290 and the impeller blades 291 are rotatable to force liquid that has been heated to flow from the inner end 101 of the spiral liquid passage 100 into the pump chamber 211.

The outlet passage 270 is formed horizontally in the motor housing unit 20, and has an inlet 271 in fluid communication with the pump chamber 211, and an outlet 272 allowing the liquid to flow out of the centrifugal pump device (C) therethrough when the impeller blades 291 are rotated. The outlet passage 270 is spaced apart from the stator cores 280 in a horizontal direction shown by the arrow (G) in FIG. 4. Preferably, the outlet passage 270 extends along a direction parallel to the stator cores 280.

Figure 5:
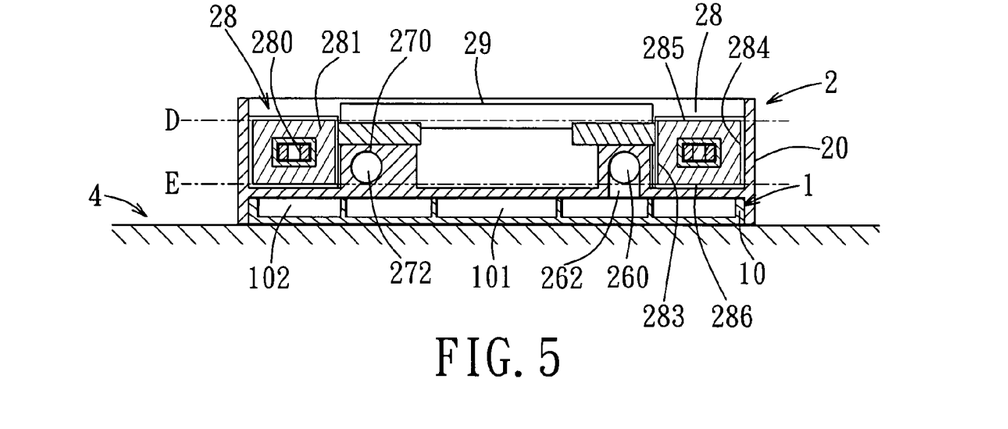
FIG. 5 is a sectional view taken along Line V-V in FIG. 3.
Figure 5A:
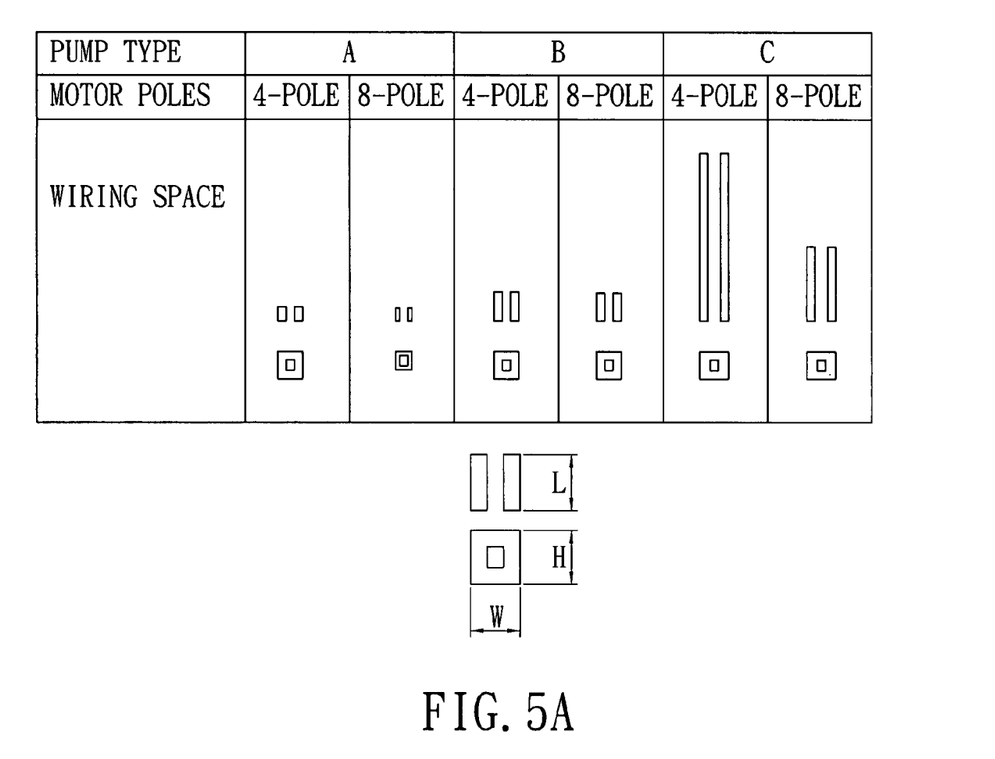
FIG. 5A is a diagram illustrating an experimental result conducted to measure wiring spaces of an internal stator motor of a conventional pump device, an external stator motor of a second conventional pump device, and a motor unit of the preferred embodiment.

Since each of the stator cores 280 is flat and extends in the direction perpendicular to and spaced part from the rotating axis (F) of the rotor 290, with further reference to FIG. 5A showing an experimental result, the length (L) of each of the wiring spaces (28A) in the pump device (C) of this invention is greater significantly than those of the above-mentioned first and second conventional pump devices (A, B) (see FIGS. 1B and 1C). Hence, the torque of the motor unit 2 can be increased. Said differently, the axial length of the motor unit 2 can be reduced.

Figure 6:
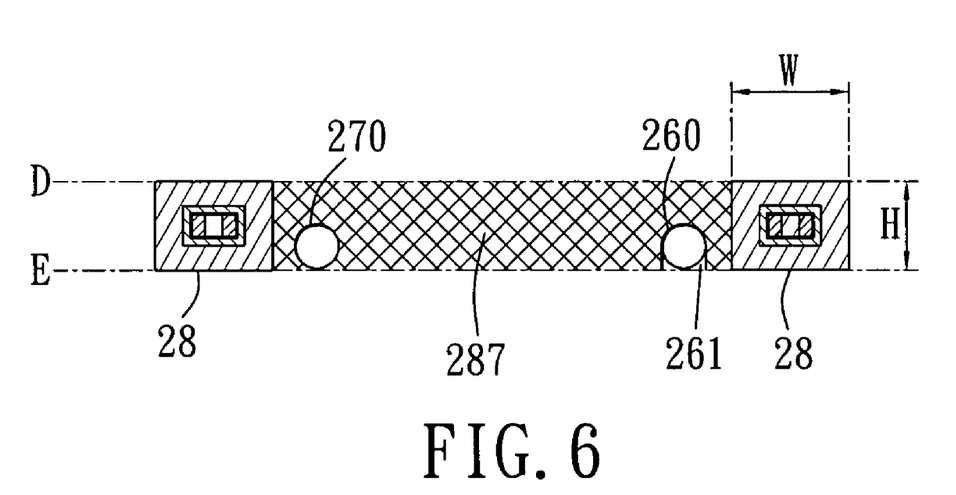
FIG. 6 is a schematic view illustrating a between-stator region.

With particular reference to FIGS. 5 and 6, each of the stator units 28 has an inner side 283 proximate to the rotor 290, an outer side 284 distal from the rotor 290, and opposite first and second lateral sides 285, 286 interconnecting the inner and outer sides 283, 284. The stator units 28 cooperate with an imaginary first line (D) extending through the first lateral sides 285 and an imaginary second line (E) extending through the second lateral sides 286 to define a between-stator region 287 thereamong. The horizontal passage portion 261 of the inlet passage 260 and the outlet passage 270 are disposed wholly within the between-stator region 287. Thus, the axial length of the pump unit 1 is further reduced.

As a consequence, the axial length of the centrifugal pump device (C) of this invention is smaller than that of the above-mentioned prior art. This is consistent with the current trend toward miniaturization in notebook computer design. Therefore, the object of this invention is achieved.

With this invention thus explained, it is apparent that numerous modifications and variations can be made without departing from the scope and spirit of this invention. It is therefore intended that this invention be limited only as indicated by the appended claims.

I claim:

1. A centrifugal pump device adapted for use with a heat-dissipating system, said centrifugal pump device comprising:
    a motor unit including a motor housing unit, at least two elongated flat stator cores disposed in said motor housing unit and spaced apart from each other, a rotor disposed rotatably in said motor housing unit between said stator cores and rotatable about a rotating axis, and at least two stator windings wound respectively on said stator cores, each of said stator cores extending in a direction perpendicular to and spaced apart from said rotating axis, each of said stator cores cooperating with a corresponding one of said stator windings to constitute a stator unit, each of said stator units having an inner side proximate to said rotor, an outer side distal from said rotor, and opposite first and second lateral sides interconnecting said inner and outer sides, said stator units cooperating with an imaginary first line extending through said first sides and an imaginary second line extending through said second sides to define a between-stator region thereamong; and
    a pump unit including:
        a pump chamber formed in said motor housing unit of said motor unit,
        a plurality of impeller blades disposed in said pump chamber and anchored to said rotor; wherein said rotor, impeller blades and pump chamber are substantially located wholly within said between-stator region,
        a pump housing unit attached fixedly and sealingly to said motor housing unit,
        a liquid passage formed in an assembly of said pump housing unit and said motor housing unit and in fluid communication with said pump chamber;
        an inlet passage formed in said motor housing unit and in fluid communication with said liquid passage, said inlet passage being adapted to allow liquid to flow into said liquid passage therethrough, said rotor and said impeller blades being rotatable to force the liquid to flow from said liquid passage into said pump chamber, and
        an outlet passage formed in said motor housing unit and in fluid communication with said pump chamber, said outlet passage being adapted to allow the liquid to flow out of said centrifugal pump device therethrough, at least a portion of said outlet passage extending into said between-stator region.

2. The centrifugal pump device as claim in claim 1, wherein said liquid passage is a spiral, and is defined between said pump housing unit and said motor housing unit.

3. The centrifugal pump device as claimed in claim 2, wherein said spiral liquid passage has an inner end disposed in proximity to a central portion of said pump housing unit and in fluid communication with said pump chamber, and an outer end disposed in proximity to a peripheral portion of said pump housing unit and in fluid communication with said inlet passage.

4. The centrifugal pump device as claimed in claim 2, wherein said pump unit further includes a rib unit disposed between said motor housing unit and said pump housing unit so as to define said spiral liquid passage.

5. The centrifugal pump device as claimed in claim 1, wherein said outlet passage is disposed wholly within said between-stator region.

6. The centrifugal pump device as claimed in claim 5, wherein said outlet passage extends in a direction parallel to said stator cores.

7. The centrifugal pump device as claimed in claim 1, wherein said inlet passage has a horizontal passage portion disposed wholly within said between-stator region.

8. The centrifugal pump device as claimed in claim 7, wherein said horizontal passage portion of said inlet passage extends in a direction parallel to said stator cores.

9. The centrifugal pump device as claimed in claim 1, wherein said stator cores are parallel to each other.

10. The centrifugal pump device as claimed in claim 1, wherein said pump housing unit includes a bottom wall disposed under said motor housing unit of said motor unit and adapted to be disposed above and in thermal contact with the heat source, and a surrounding wall extending upwardly from a periphery of said bottom wall and attached sealingly to said motor housing unit.

* * * * *